(12) United States Patent
Maeda

(10) Patent No.: US 6,574,163 B2
(45) Date of Patent: Jun. 3, 2003

(54) SEMICONDUCTOR MEMORY DEVICE WITH SINGLE CLOCK SIGNAL LINE

(75) Inventor: Kazunori Maeda, Tokyo (JP)

(73) Assignees: NEC Corporation, Tokyo (JP); Hitachi Ltd., Tokyo (JP)

( * ) Notice: Subject to any disclaimer, the term of this patent is extended or adjusted under 35 U.S.C. 154(b) by 0 days.

(21) Appl. No.: 10/113,562

(22) Filed: Apr. 2, 2002

(65) Prior Publication Data

US 2002/0145936 A1 Oct. 10, 2002

(30) Foreign Application Priority Data

Apr. 6, 2001 (JP) ....................................... 2001/108355

(51) Int. Cl.⁷ ................................................. G11C 8/00
(52) U.S. Cl. ................................. 365/233; 365/189.02
(58) Field of Search ....................... 365/189.02, 230.02, 365/230.04, 233, 230.03

(56) References Cited

U.S. PATENT DOCUMENTS

| 4,450,538 A | * | 5/1984 | Shirasaka | 365/189.02 |
| 5,093,805 A | * | 3/1992 | Singh | 365/189.02 |
| 5,570,320 A | * | 10/1996 | Runas | 365/230.03 |
| 5,663,922 A | * | 9/1997 | Tailliet | 365/189.02 |
| 5,856,947 A | * | 1/1999 | Fang | 365/189.02 |
| 6,115,280 A | * | 9/2000 | Wada | 365/230.03 |
| 6,157,238 A | | 12/2000 | Na et al. | 327/297 |
| 6,400,631 B1 | * | 6/2002 | Williams et al. | 365/189.02 |
| 6,477,107 B1 | * | 11/2002 | Lee | 365/233 |

FOREIGN PATENT DOCUMENTS

| JP | 11-66854 A | 3/1999 |
| JP | 11-163689 A | 6/1999 |
| JP | 2000-298983 A | 10/2000 |

* cited by examiner

Primary Examiner—Tan T. Nguyen
(74) Attorney, Agent, or Firm—Sughrue Mion, PLLC

(57) ABSTRACT

A semiconductor memory device includes two memory cell array sections, a single clock signal line, a clock signal generating section and a multiplexer section. The clock signal generating section generates a single first clock signal based on a second clock signal externally supplied and outputs the first clock signal onto the clock signal line. The first clock signal has twice of a frequency of the second clock signal. The multiplexer section is connected with the clock signal line and outputs first data and second data respectively read out from the two memory cell array sections in order during one period of the second clock signal in response to the first clock signal on the clock signal line.

22 Claims, 12 Drawing Sheets

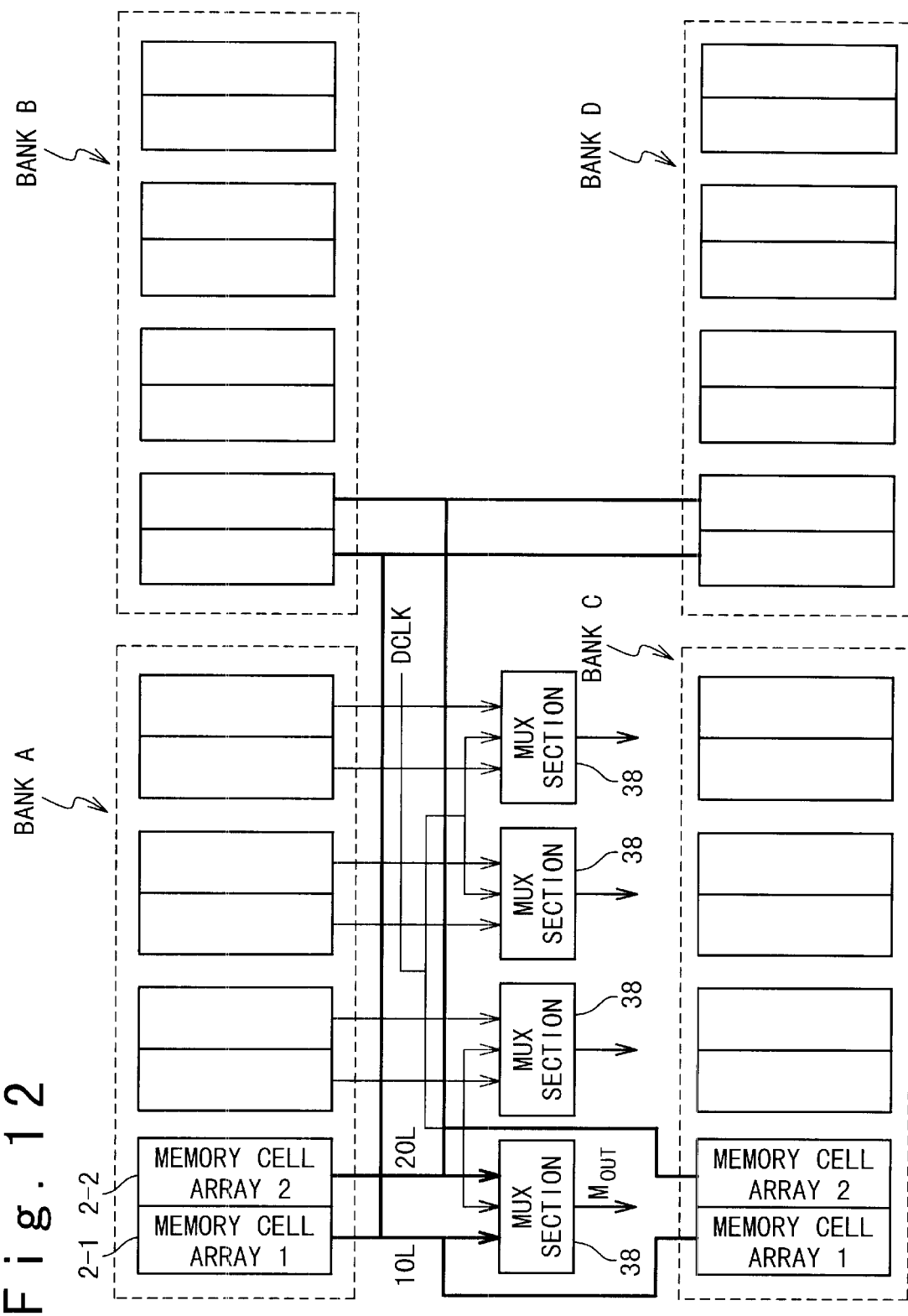

SEMICONDUCTOR MEMORY DEVICE WITH SINGLE CLOCK SIGNAL LINE

BACKGROUND OF THE INVENTION

1. Field of the Invention

The present invention relates to a semiconductor memory device, and more particularly to a synchronous type semiconductor memory device of a double data rate.

2. Description of the Related Art

Conventional, a memory apparatus like 128-M DDR-SDRAM (Double Data Rate Synchronous Dynamic Random Access the memory) is known. FIGS. 1A and 1B are block diagrams showing the outline circuit structure of the memory apparatus. Referring to FIGS. 1A and 1B, the memory device is comprised of a clock signal generating section 120, a memory cell array 1 102-1, a memory cell array 2 102-2, a data amplifier 1 106-1, a data amplifier 2 106-2 and an output circuit 108. The clock signal generating section 120 generates internal clock signals ICLK1 and ICLK2 from an external clock signal ECLK and a signal ECLKB as an inversion signal of the signal ECLK. A column decoder (not shown) to specify a Y address and a sense amplifier (not shown) to detect data read from a memory cell are provided in each of the memory cell array 1 102-1 and the memory cell array 2 102-2. The output circuit 108 has a multiplexer (MUX) 110 and an output latch buffer 114.

Data is read out from the memory cell array 1 102-1, is amplified by the data amplifier 106-1 and is outputted on a data bus 10L. Also, data is read from the memory cell array 2 102-2, is amplified by the data amplifier 106-2 and is outputted on a data bus 20L. If the data on the data bus 10L is an odd number side, the data on the data bus 20L is an even number side, and if the data on the data bus 10L is the even number side, the data on the data bus 20L is the odd number side.

The multiplexer (MUX) 110 of the output circuit 108 outputs the data on the data buses 10L and 20L to the output latch buffer 114 via a data bus Mout in order in response to the two internal clock signals ICLK1 and ICLK2 which are supplied from the clock signal generating section 120. The output latch buffer 114 outputs the data from the multiplexer (MUX) 110 to an output terminal Dout in order in response to the external clock signals ECLK and ECLKB. In this way, the data of the odd number side and the data of the even number side are outputted during one period of the external clock signal.

FIGS. 2A to 2H are timing charts showing an operation of the conventional memory device shown in FIGS. 1A and 1B. As shown in FIGS. 2A and 2B, the external clock signals ECLK and ECLKB are supplied to the clock signal generating section 120. As shown in FIGS. 2C and 2D, the clock signal generating section 120 generates the internal clock signals ICLK1 and ICLK2 from these external clock signals ECLK and ECLKB. That is, the internal clock signals ICLK1 and ICLK2 are generated to synchronize with the rising edge or falling edge of the external clock signals ECLK or ECLKB, respectively. In this way, the internal clock signals ICLK1 and ICLK2 have the frequency the same as the external clock signal. The internal clock signals ICLK1 and ICLK2 have approximately the same phase as the external clock signals ECLK and ECLKB.

The data DATA1 of the odd number side and data DATA2 of the even number side read out from the memory cell array 1 102-1 and the memory cell array 2 102-2 are amplified by the data amplifiers 106-1 and 106-2 and are outputted on the data buses 10L and 20L during one period of the internal clock signal, respectively, as shown in FIGS. 2E and 2F.

The above internal clock signals ICLK1 and ICLK2 are supplied to the multiplexer (MUX) 110. As shown in FIG. 2G, the multiplexer (MUX) 110 selects the data DATA1 on the data bus 10L in response to the rising edge of internal clock ICLK1 and outputs it to the output bus Mout. Next, the multiplexer 110 selects the data DATA2 on the data bus 20L in response to the rising edge of the internal clock ICLK2 (the falling edge of the internal clock ICLK1) and outputs it to the output bus Mout. As shown in FIG. 2H, the output latch buffer 114 outputs the data DATA1 and DATA2 from the output terminal Dout in response to the external clock signals ECLK and ECLKB, respectively. In this way, the two data DATA1 and DATA2 can be read out during one period of the external clock signal.

In such a DDR-SDRAM, a layout is often used in which a plurality of memory cell arrays are arranged on both sides of a chip, and a single clock signal generating section 120 is arranged on the center of the chip. The output circuit 108 containing the multiplexer 110 is provided for each memory cell array. The two internal clock signals ICLK1 and ICLK2 generated by the clock signal generating section 120 are supplied to each output circuit 108 as a pair, as shown in FIG. 3.

In 256-MB DDR-SDRAM, a clock signal of 166 MHz is used as the external clock signal, whose one cycle is about 6 ns. In this case, one read cycle is about 3 ns. When a high frequency clock signal is used in this way, there is a case where data cannot be read out right due to the difference between the propagation delay times of the internal clock signal, when the wiring lines for the internal clock signals are different in the length from the clock signal generating section 120 to each output circuit 108. For this reason, the wiring line of the internal clock signal is generally designed for the wiring lengths from the clock signal generating section 120 to the respective output circuits 108 to be equal, for elimination of the difference in the propagation delay time. For this purpose, as shown in FIG. 3, the wiring lines for the two internal clock signals ICLK1 and ICLK2 needs be arranged to be equal in length for the output circuits. However, in the conventional DDR-SDRAM, the mask design becomes complicated and also a chip area is wasted. Especially, when a multiple bit output circuit structure is adopted like the 16-bit output, the arrangement of the clock signal wiring lines becomes very difficult.

Also, as mentioned above, when the internal clock signal is generated using the rising edge or falling edge of the external clock signal, there is no guarantee that the duty ratio of the internal clock signal is 50%. When the duty ratio is not 50%, the durations of the internal clock signals ICLK1 and ICLK2 in the high level are different, and there is a case that the operation margin cannot be secured.

In addition, in a high speed operation DDR-SDRAM, because the period of the read cycle is short, the margin for the setup reduces. Therefore, it is desirable that the internal clock signal used for the reading operation is supplied before the reading cycle. Contrary, when the internal clock signal is too early supplied, the internal clock signal is supplied before the previous cycle ends so that there is possibly erroneous operation.

In conjunction with the above description, a clock system of a semiconductor memory device which uses a frequency multiplier is disclosed in U.S. Pat. No. 6,157,238. In this reference, an external clock signal source generates external clock signals. A controller has a master frequency amplifier and a master DLL circuit. Each of a plurality of DRAMs has the frequency multiplier and the DLL circuit. The frequency multiplier generates an internal clock signal, which has twice of the frequency of the external clock signal, from the external clock signal. The frequency multiplier has a delay circuit, a logical device and a buffer. The delay circuit generates a phase delayed clock signal based on the external clock signal. The logical device generates the internal clock signal based on the external clock signal and the phase delayed clock signal. The buffer buffers the internal clock signal and supplies it.

Also, a semiconductor memory device is disclosed in Japanese Laid Open Patent Application (JP-P2000-298983A). In this reference, the semiconductor memory device has first and second memory sections and an output section. The first memory section stores or outputs data in the rising edge of the clock signal, and the second memory section stores and outputs data in the falling edge of the clock signal. The output section outputs the data from the first and second memory sections in response to the rising edge and falling edge of the clock signal. One of the first and second memory sections, which outputs data first, is arranged near the output section.

Also, a clock multiplying circuit is disclosed in Japanese Laid Open Patent Application (JP-A-Heisei 11-163689). In this reference, a delay circuit has a plurality of delay elements and generates a multi-phase clock signal from the clock signal with an optional duty ratio. A period sensing section detects the number of delay elements necessary to delay the input clock signal for one period. A selecting section outputs a selection signal from the delayed clock signal based on the detected number of delay elements. The multiple clock generating section generates a clock signal with the duty ratio of 50% from the input clock signal through the logic inversion in the rising edge of the selection signal.

Also, a semiconductor integrated circuit is disclosed in Japanese Laid Open Patent Application (JP-A-Heisei 11-66854). In this reference, each of a plurality of first delay circuits of a delay circuit sequence has first to fourth nodes. The third node is connected to the first node of the adjacent delay circuit, and the fourth node is connected to the second node of the adjacent delay circuit. When the first node is connected to the first power supply during a first period while a first control signal is connected to a first power supply, the second to fourth nodes are connected to a second power supply, the first power supply and the second power supply in order, respectively. Also, when the fourth node is connected to the first power supply during a second period while the first control signal is connected to the second power supply, the third, second and first nodes are connected to the second power supply, the first power supply and the second power supply in order, respectively. Thus, an internal clock signal is generated with no phase difference from an external clock signal.

SUMMARY OF THE INVENTION

Therefore, an object of the present invention is to provide a semiconductor memory device in which a single clock signal is supplied to each of output circuits provided for memory cell arrays.

Another object of the present invention is to provide a semiconductor memory device in which an operation margin can be taken widely.

Still another object of the present invention is to provide a semiconductor memory device in which a chip area can be used effectively.

Yet sill another object of the present invention is to provide a semiconductor memory device in which four data can be read out a double data rate.

Also, it is an object of the present invention to provide a semiconductor memory device in which an internal clock signal is generated from external clock signals to have twice of the frequency of the external clock signal and to have the duty ratio of 50%.

In an aspect of the present invention, a semiconductor memory device includes two memory cell array sections, a single clock signal line, a clock signal generating section and a multiplexer section. The clock signal generating section generates a single first clock signal based on a second clock signal externally supplied and outputs the first clock signal onto the clock signal line. The first clock signal has twice of a frequency of the second clock signal. The multiplexer section is connected with the clock signal line and outputs first data and second data respectively read out from the two memory cell array sections in order during one period of the second clock signal in response to the first clock signal on the clock signal line.

It is desirable that the clock signal generating section generates the first clock signal to have a phase more progressive by a predetermined phase than the second clock signal.

In another aspect of the present invention, a semiconductor memory device includes a first data bus which transfers first data, a second data bus which transfers second data, a third data bus, a clock signal generating section and a multiplexer section. The clock signal generating section generates a single first clock signal from a second clock signal, and the first clock signal has twice of a frequency of the second clock signal. The multiplexer section receives the first data and the second data from the first data bus and the second data bus within one period of the second clock signal, respectively, and outputs the first data and the second data to the third data bus in order within the one period of the second clock signal in response to the first clock signal.

The semiconductor memory device may further include a plurality of memory cell arrays, each of the plurality of memory cell arrays may include a first memory cell array section and a second memory cell array section. The multiplexer section is provided for each of the plurality of memory cell arrays. The first data and the second data are respectively read out from the first memory cell array section and the second memory cell array section in one of the plurality of memory cell arrays and are supplied to the multiplexer section corresponding to the one memory cell array through the first data bus and the second data bus. In this case, the clock signal generating section may be provided for the plurality of memory cell arrays, and the clock signal generating section may supply the first clock signal to a plurality of the multiplexer sections in a same delay time. Also, the multiplexer section may include a selecting section and a control clock signal generating section. The selecting section may transfer the first data to the third data bus in response to a control clock signal and then transfers the second data to the third data bus in response to an inversion signal of the control clock signal. The control clock signal generating section may generate the control clock signal during the one period of the second clock signal in response to the first clock signal.

In this case, the selecting section may include a first transfer gate connected with the first data bus and the third data bus to transfer the first data to the third data bus in response to the control clock signal, and a second transfer gate connected with the second data bus and the third data bus to transfer the second data to the third data bus in response to the inversion signal of the control clock signal. Also, the control clock signal generating section may have a D-type flip-flop with a reset terminal. The inversion output terminal of the D-type flip-flop is connected with a data input terminal thereof. The control clock signal is outputted from an inversion output terminal of the D-type flip-flop in response to the first clock signal, and the D-type flip-flop is reset in response to a reset signal supplied to the reset terminal.

Also, it is desirable that two periods of the first clock signal corresponding to the one period of the second clock signal are equal to each other in time length. In addition, it is desirable that the clock signal generating section generates the first clock signal to have a phase more progressive by a predetermined phase than the second clock signal. Otherwise, it is desirable that the clock signal generating section generates the first clock signal based on one of a rising edge and a falling edge of the second clock signal.

In still another aspect of the present invention, a semiconductor memory device includes a first data bus which transfers first data, a second data bus which transfers second data, a third data bus which transfers third data, a fourth data bus which transfers fourth data, and a fifth data bus. A clock signal generating section generates a single first clock signal from a second clock signal, and the first clock signal has twice of a frequency of the second clock signal. A multiplexer section receives the first to fourth data from the first to fourth data buses, respectively, outputs the first data and the second data to the fifth data bus in order in a first period of the second clock signal, in response to the first clock signal, and outputs the third data and the fourth data to the fifth data bus in order to a second period of the second clock signal subsequent to the first period.

The semiconductor memory device may further include a plurality of memory cell arrays, each of the plurality of memory cell arrays may include first to fourth memory cell array sections. The multiplexer section is provided for each of the plurality of memory cell arrays. The first to fourth data are read out from the first to fourth memory cell array sections in one of the plurality of memory cell arrays, and are supplied to the multiplexer section corresponding to the one memory cell array through the first to fourth data buses. In this case, the clock signal generating section may be provided for each of the plurality of the memory cell arrays, and the clock signal generating section may supply the first clock signal to a plurality of the multiplexer sections in a same delay time.

Also, the multiplexer section may include a selecting section which transfers the first to fourth data to the fifth data bus in response to first to fourth control clock signals, and a control clock signal generating section which generates the first and second control clock signals during the first period of the second clock signal in response to the first clock signal, and generates the third and fourth control clock signals in the second period of the second clock signal. In this case, the selecting section may include a first transfer gate connected with the first data bus and the fifth data bus to transfer the first data to the fifth data bus in response to the first control clock signal, a second transfer gate connected with the second data bus and the fifth data bus to transfer the second data to the fifth data bus in response to the second control clock signal, a third the transfer gate connected with the third data bus and the fifth data bus to transfer the third data to the fifth data bus in response to the third control clock signal, and a fourth transfer gate connected with the fourth data bus and the fifth data bus to transfer the fourth data to the fifth data bus in response to the fourth control clock signal. Also, the control clock signal generating section has a counter with a reset terminal. The counter counts the first clock signal to output the first to fourth control clock signals, and the counter is reset in response to a reset signal supplied to the reset terminal.

Also, it is desirable that adjacent periods of the first clock signal corresponding to one period of the second clock signal are equal to each other. Moreover, it is desirable that the clock signal generating section generates the first clock signal to have a phase more progressive by a predetermined phase than the first clock signal. Otherwise, it is desirable that the clock signal generating section generates the first clock signal based on one of a rising edge and a falling edge of the clock signal.

In yet still another aspect of the present invention, a method of reading out data from a specified one of a plurality of memory cell arrays, may be achieved by (a) generating a single first clock signal from a second clock signal, the first clock signal having N times (N is an integer more than 1) of a frequency of the second clock signal; by (b) transferring the first clock signal to the plurality of memory cell arrays in a same delay time; by (c) generating N control clock signals from the first clock signal; and by (d) outputting N data read out from the specified memory cell array during one period of the second clock signal, in response to the N control clock signals as a series of the N data.

It is desirable that the first clock signal has a phase more progressive by a predetermined phase than the second clock signal.

BRIEF DESCRIPTION OF THE DRAWINGS

FIG. 12 is a block diagram showing the effect of the present invention.

DESCRIPTION OF THE PREFERRED EMBODIMENTS

Hereinafter, a semiconductor memory device of the present invention will be described in detail with reference to the attached drawings.

Figure 1A:
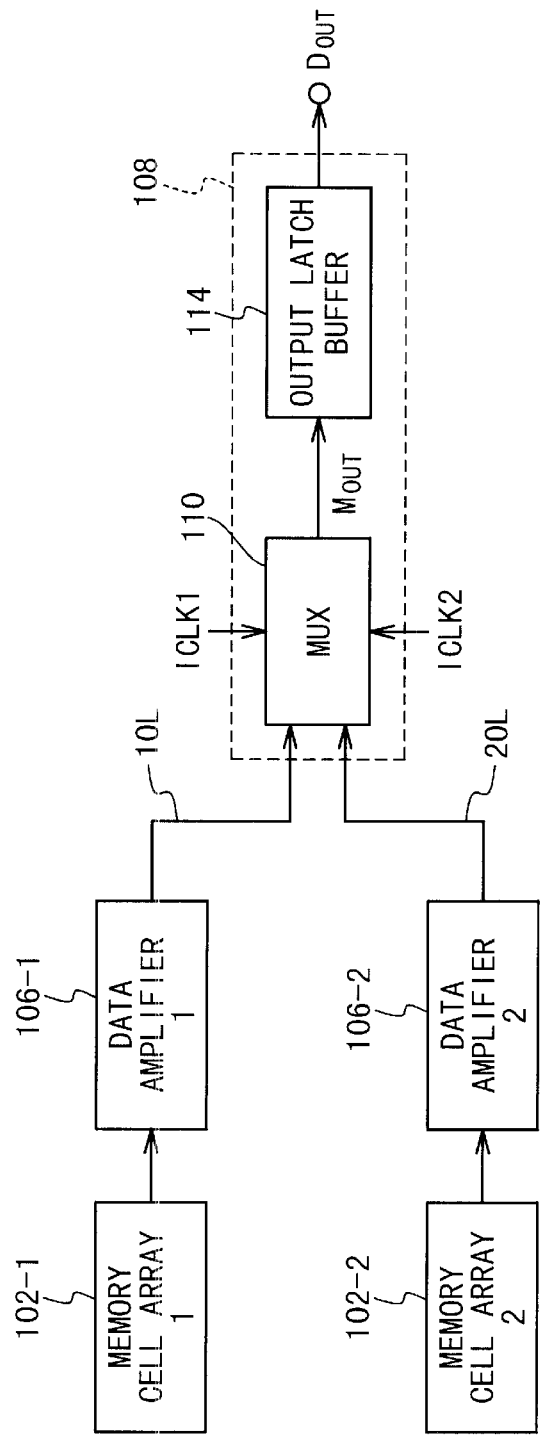
FIGS. 1A and 1B are block diagrams showing the circuit structure of a conventional semiconductor memory device.
Figure 1B:
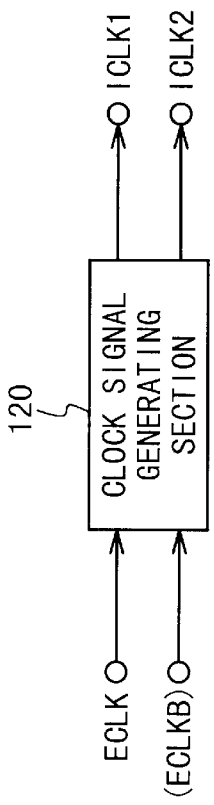
Figure 2:
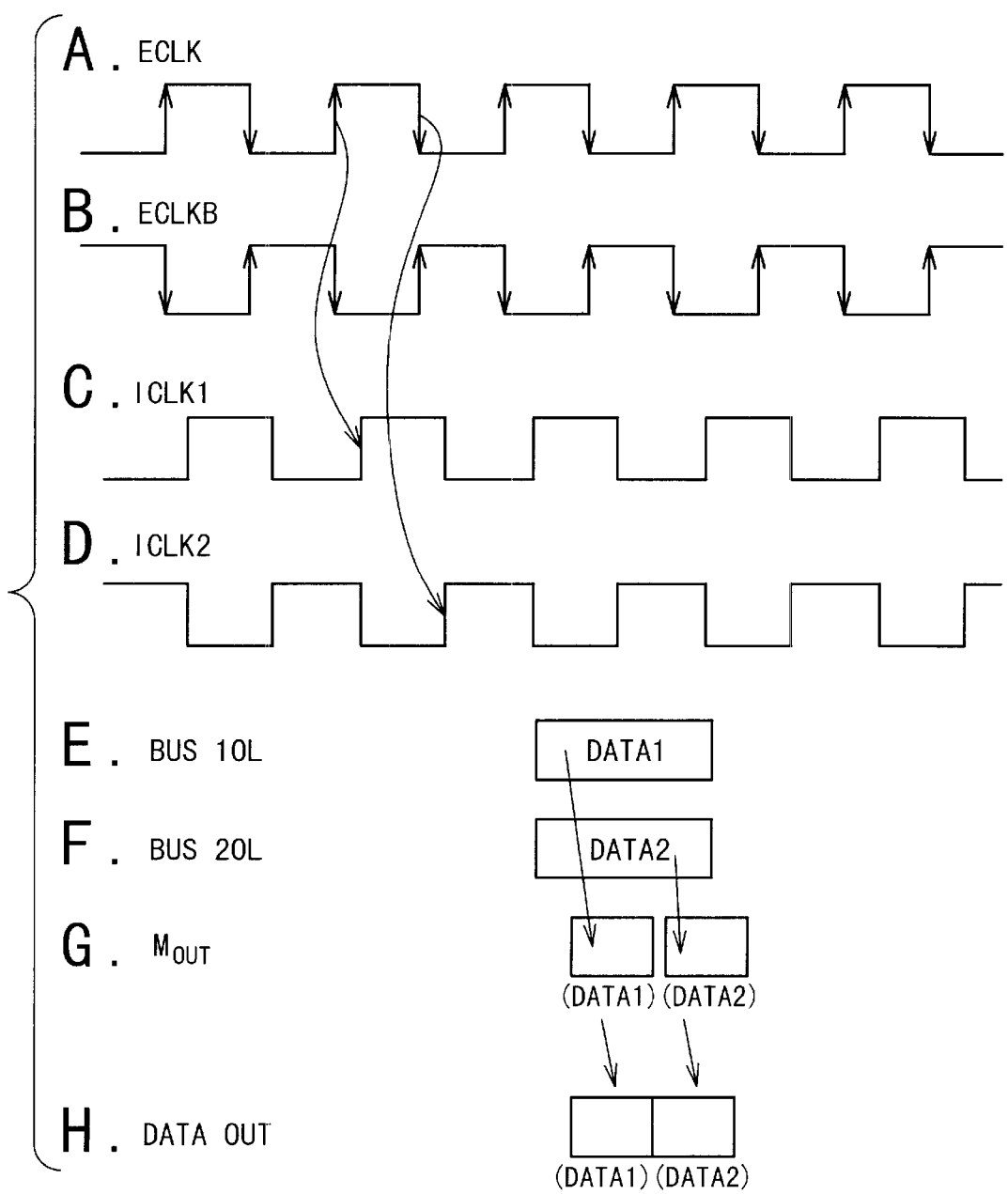
FIGS. 2A to 2H are timing charts showing the operation of the conventional semiconductor memory device.
Figure 3:
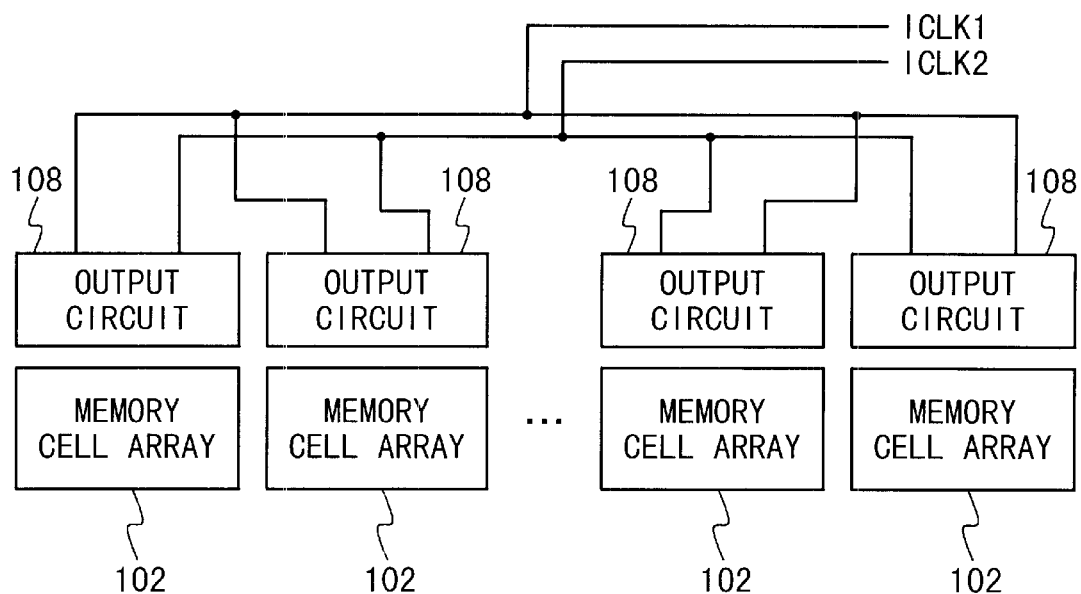
FIG. 3 is a diagram showing the equal length arrangement of wiring lines to supply two clock signals in the conventional semiconductor memory device.
Figure 4:
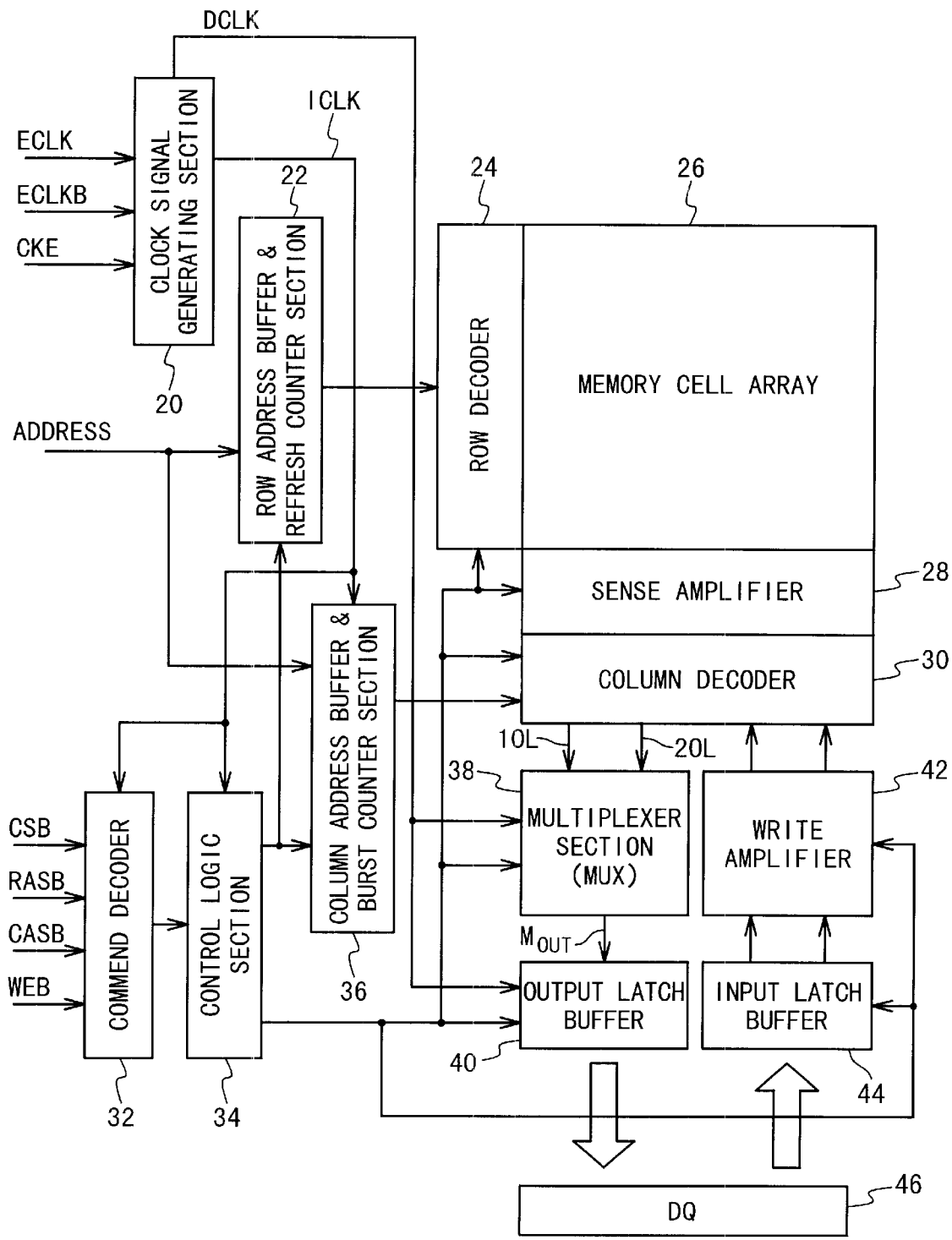
FIG. 4 is a block diagram showing the circuit structure of a semiconductor memory device of the present invention.

Referring to FIG. 4, the circuit structure of the semiconductor memory device according to the first embodiment of the present invention will be described. The semiconductor memory device is comprised of a clock signal generating section 20, a row address buffer & refresh counter section 22, a command decoder 32, a control logic section 34, a column address buffer & burst counter section 36, a memory cell array 26, a row decoder 24, a sense amplifier 28, a column decoder 30, a multiplexer section (MUX) 38, an output latch buffer 40, a write amplifier 42, and an input latch buffer 44. The multiplexer section (MUX) 38 and the output latch buffer 40 form an output circuit 50. It should be noted that in the description of the present invention, it is assumed that the description of circuits such as decoders and a sense amplifier contained in the memory cell array is omitted, except that the case where the decoder, the sense amplifier and so on are specified and described.

The clock signal generating section 20 receives an external clock signal ECLK, an inversion clock signal ECLKB of the signal ECLK and an enable signal CKE and generates internal clock signals DCLK and ICLK. The internal clock signal DCLK has twice of the frequency of the external clock signal and is used for reading and writing operations in a double data rate. The internal clock signal DCLK is supplied to the multiplexer section (MUX) 38 and the output latch buffer 40 in the output circuit 50. The internal clock signal ICLK has the same frequency as the external clock signal ECLK and is supplied to the command decoder 32, the control logic section 34, and the column address buffer & burst counter section 36.

The command decoder 32 receives a chip select signal CSB, a row address strobe RASB, a column address strobe CASB, a write enable signal WEB in response to the internal clock signal ICLK, and outputs a command signal to the control logic 34. The control logic section 34 outputs control signals to the row address buffer & refresh counter section 22, the column address & burst counter section 36, the row decoder 24, the sense amplifier 28, the column decoder 30, the multiplexer section (MUX) 38, the output latch buffer 40, the write amplifier 42, and the input latch buffer 44 based on the command signal in response to the clock signal ICLK. A reset signal Reset is contained in the control signals supplied to the multiplexer section (MUX) 38.

The row address buffer & refresh counter section 22 receives an address signal ADDRESS, and outputs one of a row address for the reading or writing operation and a row address for a refreshing operation to the row decoder 24 based on the control signal from logic section 34. The row decoder 24 decodes the row address from the row address buffer & refresh counter section 22 and outputs the decoded result to the memory cell array 26. The column address buffer & burst counter section 36 receives the address signal ADDRESS and outputs a column address for the reading and writing operation to the column decoder 30 based on the control signal from control logic section 34. The column decoder 30 decodes the column address from the column address buffer & burst counter section 36 and outputs the decoded result to the memory cell array 26.

The input latch buffer 44 latches write data from an external data bus DQ 46 based on the control signal from the control logic section 34, and outputs it to the write amplifier 42. The write amplifier 42 amplifies the write data and writes the amplified write data in a region of the memory cell array 26 specified by the row address determined by the row decoder 24 and the column address determined by column decoder 30.

Also, read data is read out from the region of the memory cell array 26 which is specified by the row address determined by the row decoder 24 and the column address determined by column decoder 30, is sensed by the sense amplifier 28 and is outputted to the multiplexer section (MUX) 38. The multiplexer section (MUX) 38 selects and outputs the read data to the output latch buffer 40 based on the control signal from the control logic section 34 in response to the internal clock signal DCLK. The output latch buffer 40 latches the read data from the multiplexer section (MUX) 38 in response to the internal clock signal DCLK and outputs to the external data bus 46 based on the control signal from the control logic section 34 in response to the external clock signal ECLK. At this time, for example, the inside of the memory cell array 26 is divided into four banks, as shown in FIG. 12. Each bank is comprised of a plurality of memory cell array sections and each memory cell section is separated into the memory cell array 1 and the memory cell array 2. One of the memory cell array 1 and the memory cell array 2 is an odd number side and the other becomes an even number side. In this embodiment, the data read out from the memory cell array of the odd number side is first outputted on the data bus 10L, and then the data read out from the memory cell array of the even number side is outputted on the data bus 20L.

The multiplexer section (MUX) 38 first outputs the data on the data bus 10L to the output bus Mout and next the data on the data bus 20L to the output bus Mout, within one period of the external clock signal ECLK in response to the internal clock signal DCLK. The output latch buffer 40 latches the data on the data bus Mout and outputs it onto the external data bus 46. The multiplexer section (MUX) 38 is formed in the neighborhood of the corresponding memory cell array section. In this way, it is desirable that the multiplexer section (MUX) 38 is physically arranged in the nearer position to the corresponding memory cell array section than the clock signal generating section 20.

Next, a semiconductor memory device according to the first embodiment of the present invention will be described more specifically.

Figure 5:
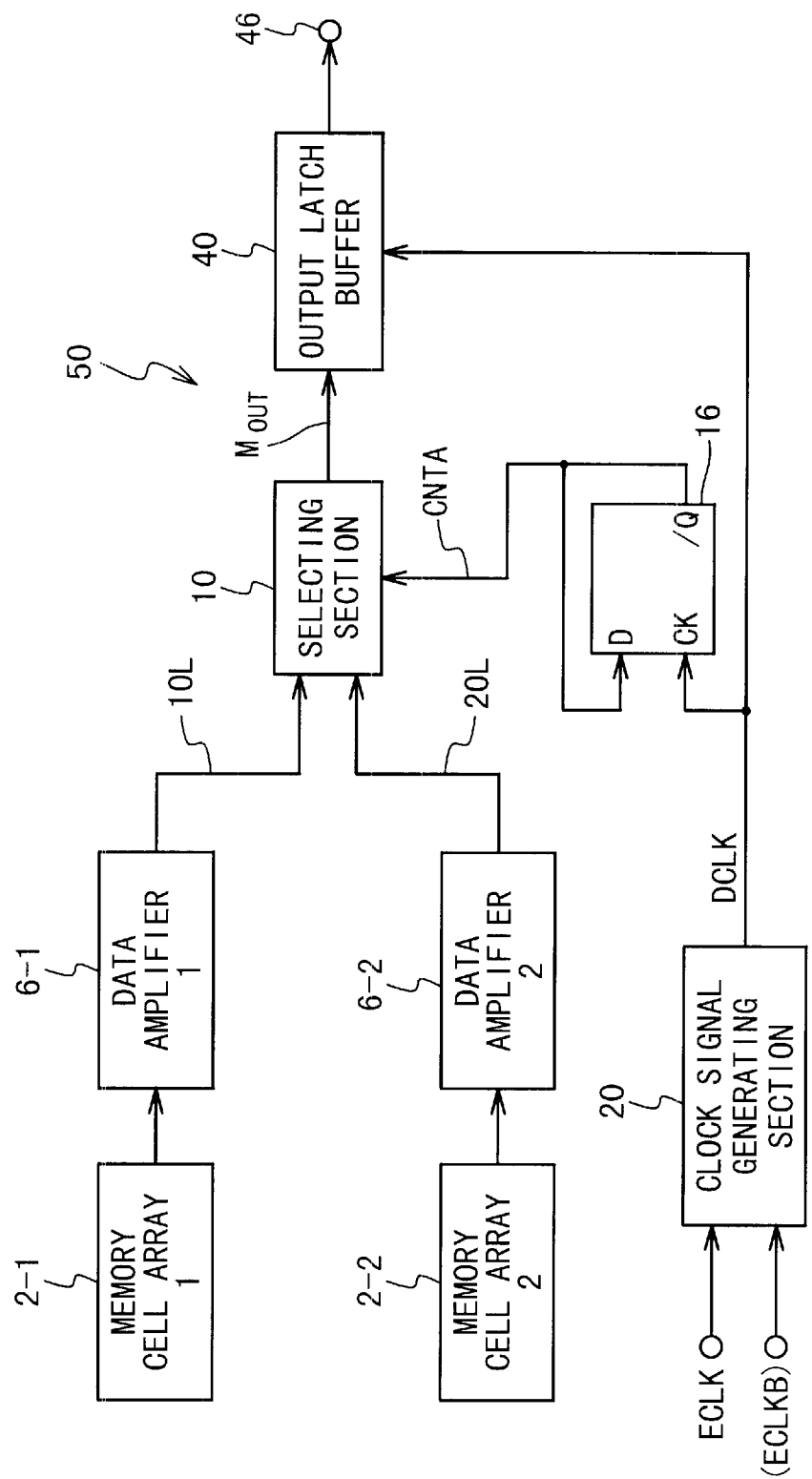
FIG. 5 is an outline block diagram of the semiconductor memory device according to a first embodiment of the present invention.
Figure 6:
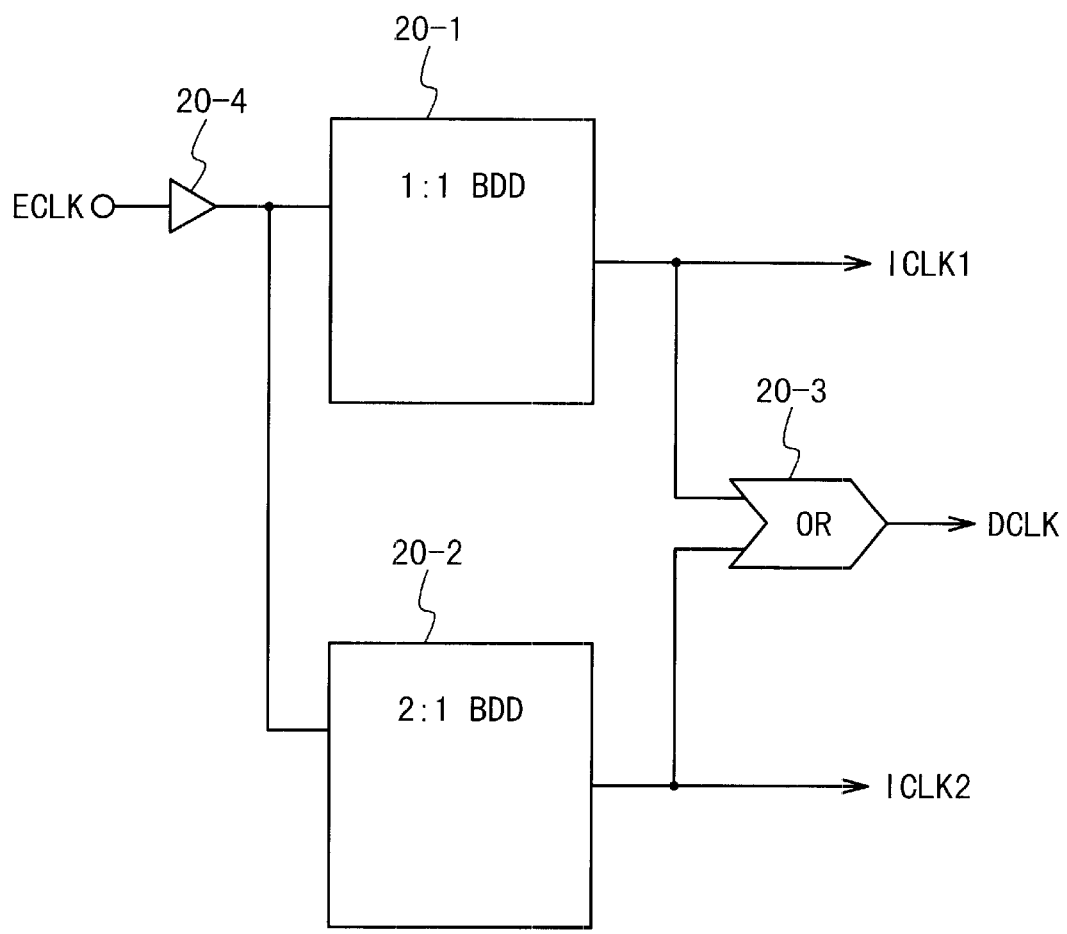
FIG. 6 is a block diagram showing the circuit structure of a clock signal generating section in the semiconductor memory device according to the first embodiment of the present invention.

Referring to FIG. 5, the semiconductor memory device according to the first embodiment is comprised of a clock signal generating section 20, a memory cell array 1 2-1, a memory cell array 2 2-2, data amplifiers 6-1 and 6-2, a multiplexer section (MUX) 38, the output latch buffer 40. The multiplexer section (MUX) 38 is comprised of a multiplexer circuit 10 and a clock signal generating circuit 16. FIG. 6 is a block diagram showing the circuit structure of the clock signal generating section 20. Referring to FIG. 6, the clock signal generating section 20 is comprised of a single data rate BDD (1:1 BDD: Bi-Directional Delay) circuit 20-1, a double data rate BDD (2:1 BDD) circuits 20-2, an OR gate 20-3 and a buffer 20-4.

The external clock signal ECLK (if necessary, the external clock signal ECLKB, too) is supplied to the single data rate BDD circuit 20-1 and the double data rate BDD circuit 20-2 through the buffer 20-4. The single data rate BDD circuit 20-1 delays the external clock signal ECLK by the first predetermined delay time and generates the internal clock signal ICLK1 which has a rising edge synchronous with the rising edge of the external clock signal ECLK. Therefore, the internal clock signal ICLK1 has the same frequency as the external clock signal ECLK but the duty ratio of the internal clock signal ICLK1 is less than 50%. Also, the double data rate BDD circuit 20-2 delays the external clock signal ECLK by a second predetermined delay time and generates the internal clock signal ICLK2 which has the rising edge synchronous with the falling edge of the external clock signal ECLK. The second predetermined delay time is equal to a summation of the above-mentioned first predetermined delay time and a half of the period of the external clock signal ECLK. Therefore, the internal clock signal ICLK2 has the same frequency as the external clock signal ECLK but the duty ratio of the internal clock signal ICLK2 is less than 50%. Here, the internal clock signal ICLK of FIG. 4 is the internal clock signal ICLK1 or ICLK2.

The OR gate 20-3 calculates the logical summation of the internal clock signals ICLK1 and ICLK2 and outputs as the internal clock signal DCLK. Therefore, the internal clock signal DCLK has a pulse for every half of the one period of the external clock signal ECLK. The internal clock signal DCLK is generated as a single signal which has twice of the frequency of the external clock signal ECLK.

Because the internal clock signal DCLK is generated using only the rising edge of the external clock signal ECLK, the two periods of the internal clock signal DCLK corresponding to one period of the external clock signal ECLK becomes equal to each other, even if the duty ratio of the external clock signal changed. In other words, because the internal clock signal DCLK is generated to have twice of the frequency of the external clock signal ECLK using the predetermined delay times, the internal clock signal DCLK does not undergo influence by the change of the duty ratio of the external clock signal ECLK.

At this time, it is desirable that the first delay time is set to be smaller than an integer times of one period of the external clock signal ECLK by a predetermined phase difference. By this, the internal clock signal DCLK can have the phase more progressive than a corresponding pulse of the external clock signal ECLK. If this phase difference is within a predetermined value, e.g., a time less than 0.6 ns, the phase of the internal clock signal DCLK can be made more progressive than the external clock signal ECLK. As a result, the output data can be set up earlier, and the data output can be made to synchronize with the external clock signal ECLK. In this way, a margin for the access to the memory cell array such as the setup time can be expanded.

Figure 7:
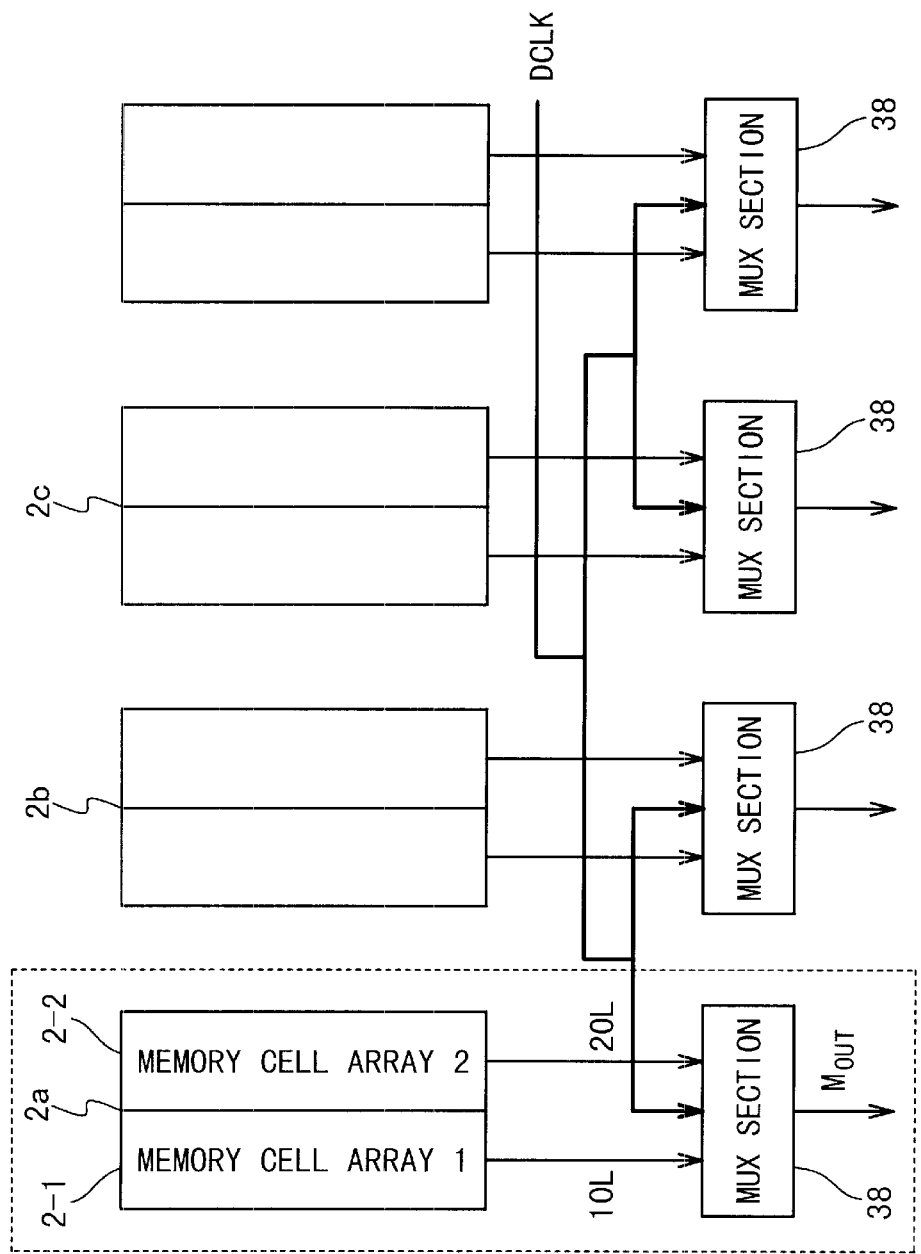
FIG. 7 is a diagram showing the equal length arrangement of wiring lines for an internal clock signal in the semiconductor memory device according to the first embodiment of the present invention.

The single double data rate internal clock signal DCLK is generated by the clock signal generating section 20 and is supplied to the multiplexer section (MUX) 38 and the output latch buffer 40. As a result, as shown in FIG. 7, the single internal clock signal DCLK is supplied to the multiplexer sections (MUX) 38 on an actual chip in the equal length structure for a single set of wiring lines. Therefore, the delay times to all the multiplexer sections (MUX) 38 can be easily made equal. In the conventional example, the two internal clock signals ICLK1 and ICLK2 need to be supplied to the respective multiplexer sections (MUX) in the equal length structure for two set of wiring lines. Thus, the wiring line design became complicated and wasted chip area. However, in the semiconductor memory device of the present invention, it is easy to design the equal length structure for the single set of wiring lines and it is possible to reduce a chip area for the wiring lines, compared with the conventional example.

Figure 8:
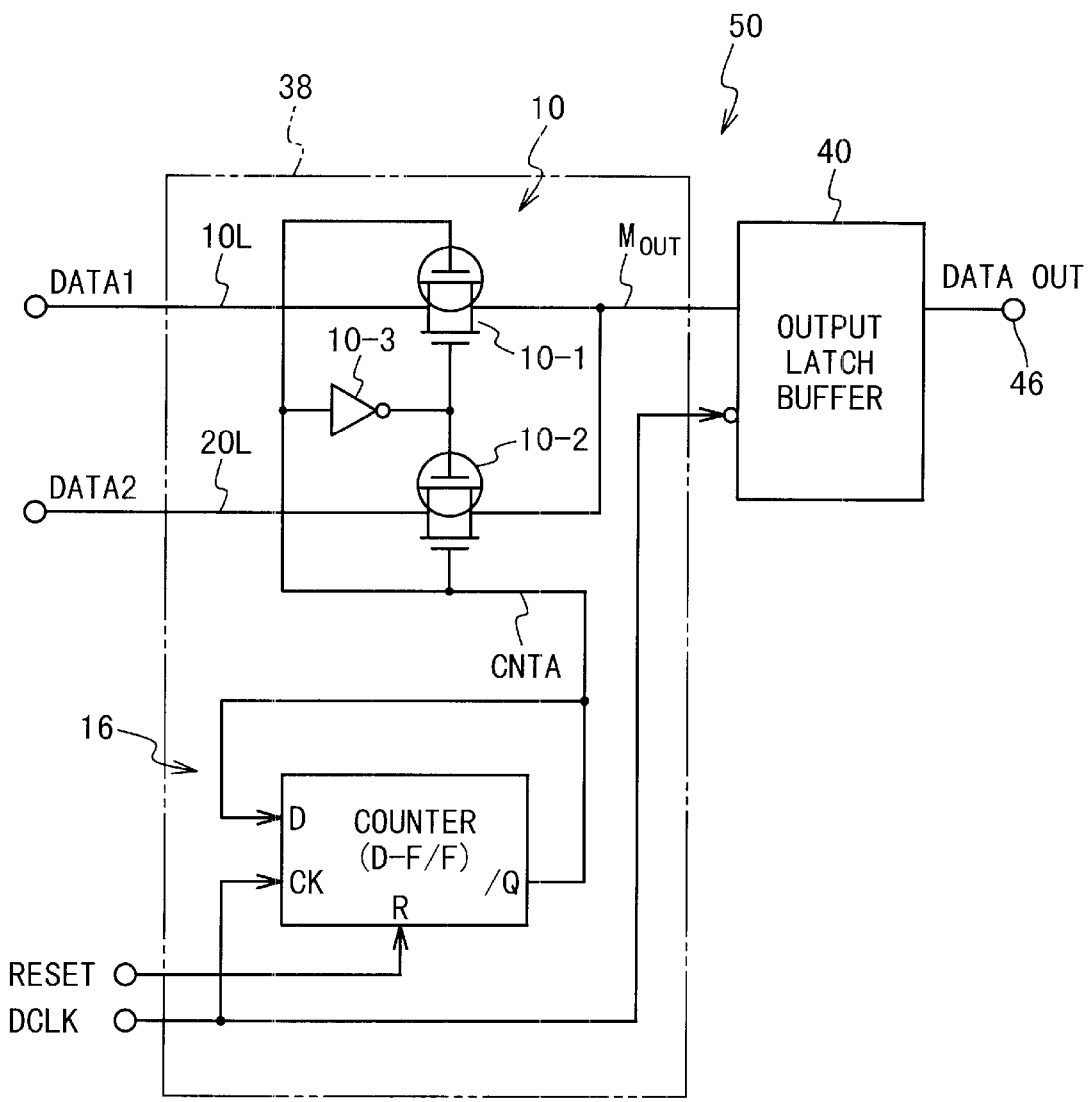
FIG. 8 is a block diagram showing the circuit structure of a multiplexer section in the semiconductor memory device the first embodiment of the present invention.

Next, the circuit structure of the multiplexer section (MUX) 38 and output latch buffer 40 in the output circuit 50 will be described. Referring to FIG. 8, the multiplexer section (MUX) 38 is comprised of a selecting section 10 and a control clock signal generating section 16.

The selecting section 10 is comprised of transfer gates 10-1 and 10-2 and an inverter 10-3. The transfer gate 10-1 is connected with the data bus 10L and the data bus Mout, and the transfer gate 10-2 is connected with the data bus 20L and the data bus Mout. The gate on the P-channel side of the transfer gate 10-1, the gate of the N-channel side of the transfer gate 10-2 and the input of the inverter 10-3 are connected in common. Also, the output of the inverter 10-3, a gate on the N-channel side of the transfer gate 10-1, a gate of the P-channel side of the transfer gate 10-2 are connected in common.

The control clock signal generating section 16 has a D-type counter (D-type flip-flop). An inversion output/Q of the D-type counter is connected with the D input terminal of the D-type counter and the input of the inverter 10-3 as the clock signal CNTA. The internal clock signal DCLK is supplied to the clock input terminal CK of the D-type counter. Also, the reset signal Reset is supplied to the reset terminal R of the D-type counter from the control logic section 34.

Also, the output latch buffer 40 is connected with the data bus Mout and the output bus 46. The internal clock signal DCLK is supplied to the output latch buffer 40.

Next, an operation of the semiconductor memory device according to the first embodiment of the present invention will be described, with reference to FIGS. 9A to 9G.

Figure 9:
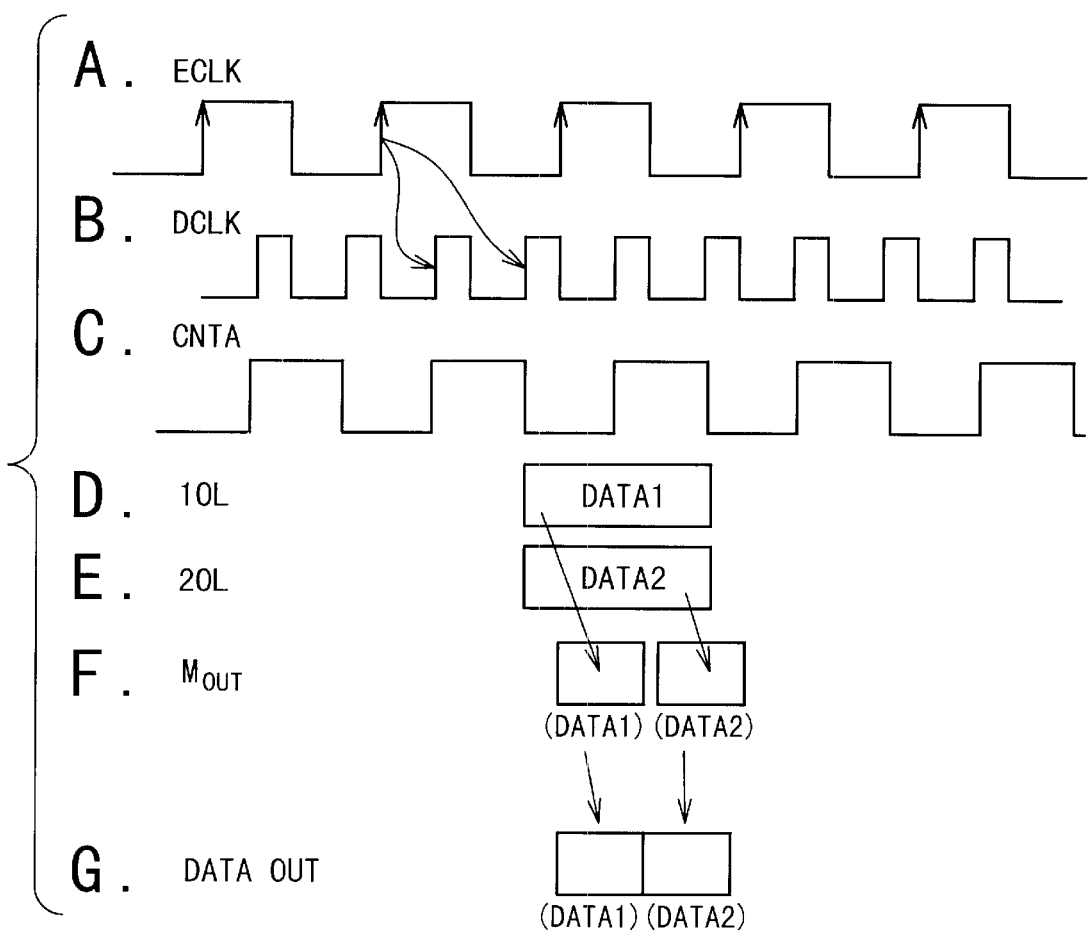
FIGS. 9A to 9G are timing charts showing the operation of the semiconductor memory device according to the first embodiment of the present invention.

The clock signal generating section 16 is reset in response to the reset signal Reset from the control logic section 34. Therefore, the inversion output/Q of the D-type counter in the control clock signal generating section 16 become a low level. As shown in FIG. 9B, the clock signal generating section 20 generates the single internal clock signal DCLK in response to the external clock signal ECLK or the inverted signal ECLKB shown in FIG. 9A. The internal clock signal DCLK has twice of the frequency of the external clock signal ECLK as mentioned above. The internal clock signal DCLK is supplied to the clock input terminal of the D-type counter in the control clock signal generating section 16.

Parallel data is read out from the memory cell array 1 2-1, is amplified by the data amplifier 6-1 and is outputted on the data bus 10L. Also, parallel data is read out from the memory cell array 22-2, is amplified by the data amplifier 6-2 and is outputted on the data bus 20L. If the data on the data bus 10L is the odd number side, the data on the data bus 20L is the even number side. Also, if the data on the data bus 10L is the even number side, the data on the data bus 20L is the odd number side.

As shown in FIG. 9C, the clock signal generating section 16 outputs the control clock signal CNTA to the selecting section 10 in response to the internal clock signal DCLK. As shown in FIG. 9F, in response to control the clock signal CNTA, the selecting section 10 outputs the data on the data bus 10L onto the data bus Mout in a first period of the two periods of the internal clock signal DCLK and then outputs the data on the data bus 20L onto the data bus Mout in a second period. That is, the both data are outputted onto the data bus Mout during one period of the external clock signal ECLK.

In this way, the control clock signal generating section 16 is reset in response to the reset signal Reset from the control logic section 34. After the reset, the clock signal generating section 16 which has the D-type counter counts the internal clock signal DCLK. As a result, as shown in FIG. 9C, the control clock signal CNTA is generated and is outputted from the inversion output terminal /Q to the selecting section. The control clock signal CNTA has the same frequency as the external clock signal ECLK and the duty ratio of 50%.

When the control clock signal CNTA is in the low level, the transfer gate 10-1 is set to a conductive state and the transfer gate 10-2 is in the non-conductive state. Thus, as shown in FIG. 9F, the data DATA1 on the data bus 10L is transferred onto the output bus Mout. Subsequently, the output latch buffer 40 latches the data on the data bus Mout in response to the internal clock signal DCLK, and outputs the latched data to the output bus Dout in response to the external clock signal ECLK.

After that, when the control clock signal CNTA changes to a high level in the following half period, the transfer gate 10-1 is set to a non-conductive state and the transfer gate 10-2 is set to the conductive state. In this way, as shown in FIG. 9F, the data DATA2 on the data bus 20L is transferred onto the output bus Mout. The output latch buffer 40 latches the data on the data bus Mout in response to the internal clock signal DCLK and outputs the latched data to the output bus Dout in response to the external clock signal ECLK or the inversion signal ECLKB of the signal ECLK. In this way, data of the odd number side and data of the even number side are outputted during one period of the external clock signal ECLK. At this time, because the internal clock signal DCLK has twice of the frequency of the external clock signal ECLK, the control clock signal CNTA has the same frequency as the external clock signal ECLK. In this way, the data DATA1 and DATA2 can be read from the semiconductor memory device in a double data rate.

Next, the semiconductor memory device according to the second embodiment of the present invention will be described.

Figure 10:
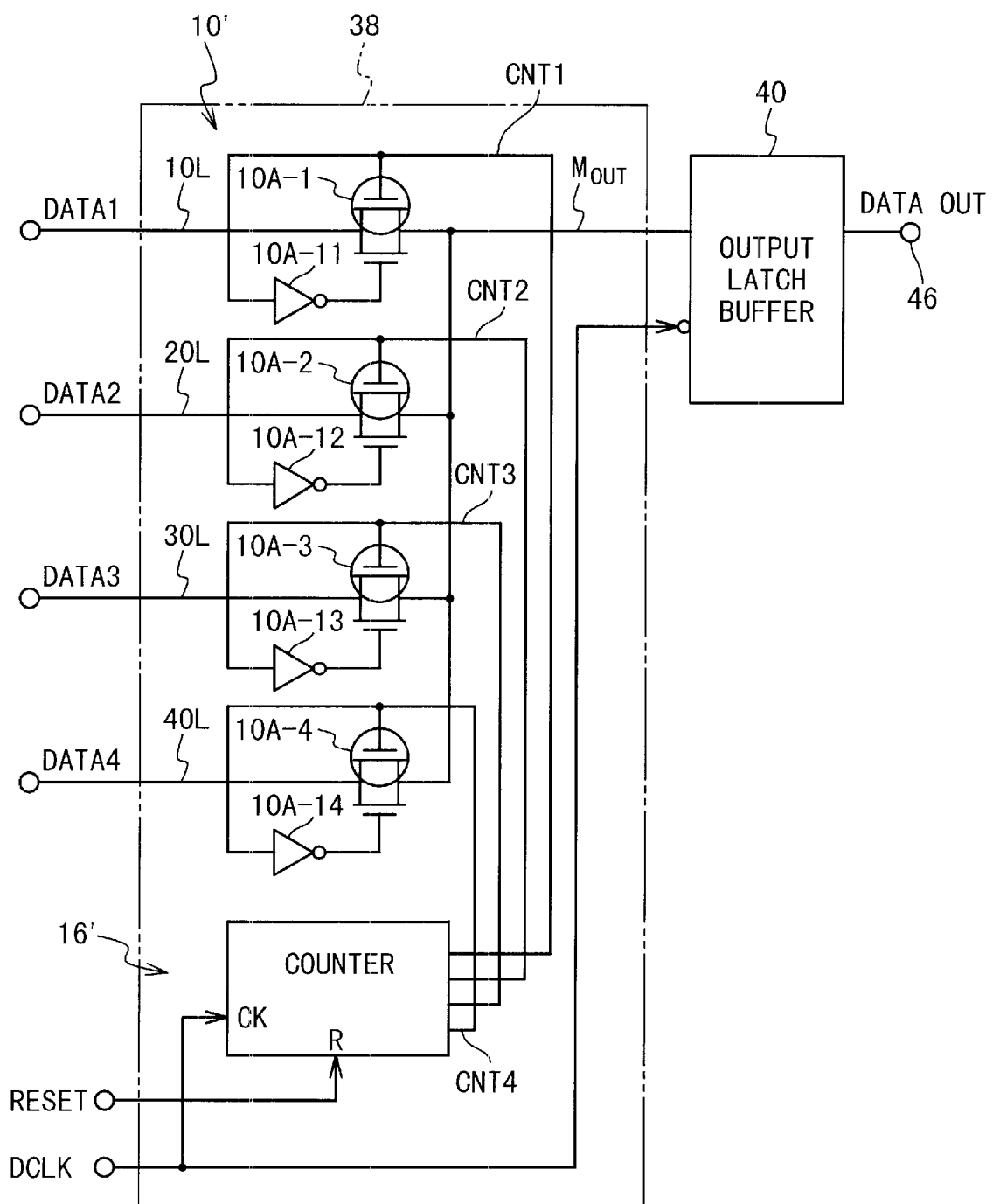
FIG. 10 is a block diagram showing the circuit structure of the multiplexer section in the semiconductor memory device according to a second embodiment of the present invention.

FIG. 10 shows the circuit structure of the output circuit 50 in the semiconductor memory device according to the second embodiment. In the second embodiment, four data can be read in the double data rate over two periods of the external clock signal ECLK. Here, although being not shown, the memory cell array is comprised of a plurality of banks. Each bank is comprised of a plurality of memory cell array sections and each memory cell array section is comprised of four memory cell arrays 1–4. Like the first embodiment, one of the data amplifiers 1–4 is provided for each of the four memory cell arrays 1–4. The data read out from the four memory cell arrays 1–4 are outputted on the data buses 10L, 20L, 30L and 40L after amplified by the data amplifiers 1–4, respectively.

Referring to FIG. 10, the output circuit 50 is comprised of the multiplexer section (MUX) 38 and the output latch buffer 40, and the multiplexer section (MUX) 38 is comprised of a selecting section 10' and a control clock signal generating section 16'.

The selecting section 10' is comprised of transfer gates 10A-1, 10A-2, 10A-3, and 10A-4 and inverters 10A-11, 10A-12, 10A-13, and 10A-14. The transfer gate 10A-1 is connected with the data bus 10L and the data bus Mout, and the transfer gate 10A-2 is connected with the data bus 20L and the data bus Mout. Also, the transfer gate 10A-3 connected with the data bus 30L, and the data bus Mout, and the transfer gate 10A-4 is connected with the data bus 40L and the data bus Mout. The input terminal of each of the inverters 10A-11, 10A-12, 10A-13, and 10A-14 is connected with the gate on the side of the P-channel of a corresponding transfer gate, and the output terminal of the inverter is connected with the gate of the side of the N-channel.

The control clock signal generating section 16 has a counter. The control clock signals CNT1, CNT2, CNT3, and CNT4 as the outputs of the counter are connected with the gates of the side of the P-channel at the transfer gates 10A-1, 10-A2, 10A-3, and 10A-4, respectively. The internal clock signal DCLK is supplied to the clock input terminal CK of the counter. Also, the reset signal Reset is supplied to the reset terminal R of the counter from the control logic section 34.

Also, the output latch buffer 40 is connected with the data bus Mout and the output bus 46. The output latch buffer 40 latches data on the data bus Mout in response to the internal clock signal DCLK and outputs the latched data to the output bus 46 in response to the external clock signal.

Next, an operation of the semiconductor memory device according to the second embodiment of the present invention will be described with reference to FIGS. 11A to 11L.

Figure 11:
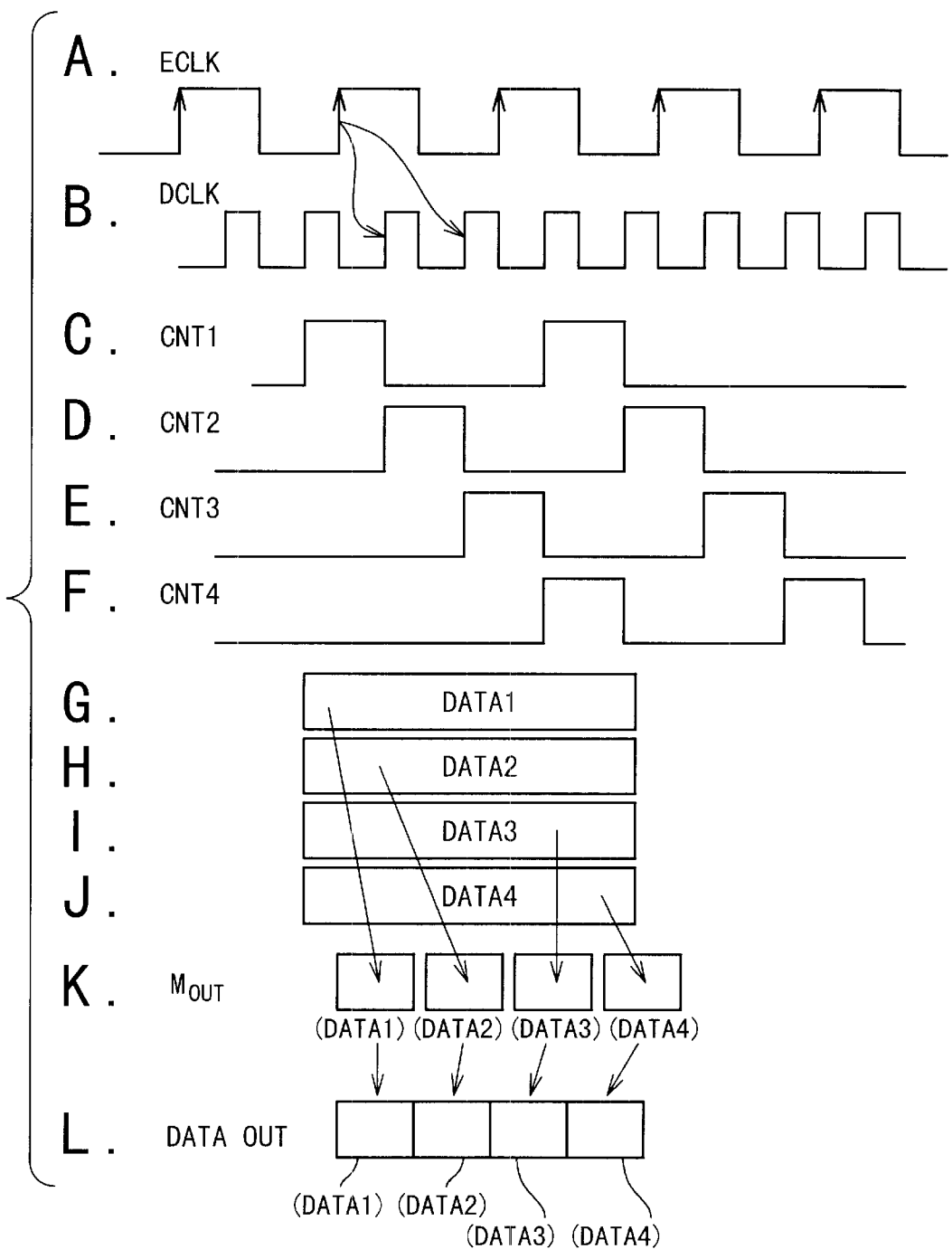
FIGS. 11A to 11L are timing charts showing the operation of the semiconductor memory device according to the second embodiment of the present invention.

First, like the first embodiment of FIG. 4, the external clock signal ECLK is supplied to the semiconductor memory device. The clock signal generating section 20 generates only the internal clock signal DCLK using one of the rising edge or the falling edge of the external clock signal ECLK. As shown in FIG. 11B, the internal clock signal DCLK has twice of the frequency of the external clock signal ECLK.

Next, the counter of the control clock signal generating section 16 is reset in response to the reset signal Reset from the control logic section 34. Then, the internal clock signal DCLK is supplied to the control clock signal generating section 16 and the control clock signals CNT1, CNT2, CNT3, and CNT4 are generated, as shown in FIGS. 11C to 11F. At this time, like the example shown in FIG. 5, the data are read out from the memory cell arrays 1–4, as shown in FIGS. 11G to 11J, and are supplied to the multiplexer section 38.

The transfer gate 10A-1 is set to a conductive state in response to the control clock signal CNT1. As shown in FIG. 11K, the data DATA1 on the data bus 10L is transferred onto the output bus Mout in a first period of the internal clock signal DCLK. Subsequently, the transfer gate 10A-2 is set to a conductive state in response to the control clock signal CNT2. As shown in FIG. 11K, the data DATA2 on the data bus 20L is transferred onto the output bus Mout in a second period of the internal clock signal DCLK. Subsequently, the transfer gate 10A-3 is set to a conductive state in response to the internal clock signal DCLK. As shown in FIG. 11K, the data DATA3 on the data bus 30L is transferred onto output bus Mout in a third period of the internal clock signal DCLK. Subsequently, the transfer gate 10A-4 is set to a conductive state in response to control the clock signal CNT4. As shown in FIG. 11K, the data DATA4 on the data bus 40L is transferred onto the output bus Mout in a fourth period of the internal clock signal DCLK. In this way, the data on output bus Mout are latched in response to the internal clock signal DCLK and outputted onto the external data bus 46 in response to the external clock signal. The internal clock signal DCLK has twice of the frequency of the external clock signal ECLK. In this way, the four data can be read out from the semiconductor memory device in the double data rate in the two periods of the external clock signal.

In this way, the present invention can be applied to a case of n (n is a natural number). As described above, 2n data can be read out in n periods of the external clock signal. Also, if the internal clock signal has n times of the frequency of the external clock signal, n data can be read out in one period of the external clock signal.

As described above, according to the semiconductor memory device of the present invention, a single internal clock signal is supplied to the output circuit corresponding to each memory cell array. Therefore, the equal length wiring line structure for the internal clock signal can be designed easily. Also, because the supplied internal clock signal is single, a chip area can be used effectively.

According to also the semiconductor memory device of the present invention, the internal clock signal is generated from one of the rising edge or falling edge of the external clock signal to have twice of the frequency of the external clock signal. Therefore, the internal clock signal does not undergo influence by the duty ratio of the external clock signal, so that two adjacent periods of the internal clock signal are equal to each other. As a result, the operation margin can be widely taken.

Also, according to the semiconductor memory device of the present invention, the four data can be read out in the double data rate as well as the case of two data.

According to the semiconductor memory device of the present invention, two internal clock signals are multiplexed into the internal clock signal DCLK and the internal clock signal DCLK is separated into two when necessary. In this way, the wiring line area can be reduced.

What is claimed is:

1. A semiconductor memory device comprising:

two memory cell array sections;

a single clock signal line;

a clock signal generating section which generates a single first clock signal based on a second clock signal externally supplied and outputs said first clock signal onto said clock signal line, said first clock signal having twice of a frequency of said second clock signal; and a multiplexer section which is connected with said clock signal line and outputs first data and second data respectively read out from said two memory cell array sections in order during one period of said second clock signal in response to said first clock signal on said clock signal line.

2. The semiconductor memory device according to claim 1, wherein said clock signal generating section generates said first clock signal to have a phase more progressive by a predetermined phase than said second clock signal.

3. A semiconductor memory device comprising:

a first data bus which transfers first data;

a second data bus which transfers second data;

a third data bus;

a clock signal generating section which generates a single first clock signal from a second clock signal, said first clock signal has twice of a frequency of said second clock signal; and a multiplexer section which receives said first data and said second data from said first data bus and said second data bus within one period of said second clock signal, respectively, and outputs said first data and said second data to said third data bus in order within said one period of said second clock signal in response to said first clock signal.

4. The semiconductor memory device according to claim 3, further comprising:

a plurality of memory cell arrays, each of said plurality of memory cell arrays comprising a first memory cell array section and a second memory cell array section, wherein said multiplexer section is provided for each of said plurality of memory cell arrays, and said first data and said second data are respectively read out from said first memory cell array section and said second memory cell array section in one of said plurality of memory cell arrays and are supplied to said multiplexer section corresponding to said one memory cell array through said first data bus and said second data bus.

5. The semiconductor memory device according to claim 4, wherein said clock signal generating section is provided for said plurality of memory cell arrays, and said clock signal generating section supplies said first clock signal to a plurality of said multiplexer sections in a same delay time.

6. The semiconductor memory device according to claim 4, wherein said multiplexer section comprises:

a selecting section which transfers said first data to said third data bus in response to a control clock signal and then transfers said second data to said third data bus in response to an inversion signal of said control clock signal; and a control clock signal generating section which generates said control clock signal during said one period of said second clock signal in response to said first clock signal.

7. The semiconductor memory device according to claim 6, wherein said selecting section comprises:

a first transfer gate connected with said first data bus and said third data bus to transfer said first data to said third data bus in response to said control clock signal; and a second transfer gate connected with said second data bus and said third data bus to transfer said second data to said third data bus in response to said inversion signal of said control clock signal.

8. The semiconductor memory device according to claim 6, wherein said control clock signal generating section has a D-type flip-flop with a reset terminal, an inversion output terminal of said D-type flip-flop is connected with a data input terminal thereof, said control clock signal is outputted from an inversion output terminal of said D-type flip-flop in response to said first clock signal, and said D-type flip-flop is reset in response to a reset signal supplied to said reset terminal.

9. The semiconductor memory device according to claim 3, wherein two periods of said first clock signal corresponding to said one period of said second clock signal are equal to each other in time length.

10. The semiconductor memory device according to claim 3, wherein said clock signal generating section generates said first clock signal to have a phase more progressive by a predetermined phase than said second clock signal.

11. The semiconductor memory device according to claim 3, wherein said clock signal generating section generates said first clock signal based on one of a rising edge and a falling edge of said second clock signal.

12. A semiconductor memory device comprising:

a first data bus which transfers first data;

a second data bus which transfers second data;

a third data bus which transfers third data;

a fourth data bus which transfers fourth data;

a fifth data bus;

a clock signal generating section which generates a single first clock signal from a second clock signal, said first clock signal having twice of a frequency of said second clock signal; and a multiplexer section which receives said first to fourth data from said first to fourth data buses, respectively, outputs said first data and said second data to said fifth data bus in order in a first period of said second clock signal, in response to said first clock signal, and outputs said third data and said fourth data to said fifth data bus in order to a second period of said second clock signal subsequent to said first period.

13. The semiconductor memory device according to claim 12, further comprising a plurality of memory cell arrays, each of said plurality of memory cell arrays comprising first to fourth memory cell array sections, wherein said multiplexer section is provided for each of said plurality of memory cell arrays, and said first to fourth data are read out from said first to fourth memory cell array sections in one of said plurality of memory cell arrays, and are supplied to said multiplexer section corresponding to said one memory cell array through said first to fourth data buses.

14. The semiconductor memory device according to claim 13, wherein said clock signal generating section is provided for each of said plurality of the memory cell arrays, and said clock signal generating section supplies said first clock signal to a plurality of said multiplexer sections in a same delay time.

15. The semiconductor memory device according to claim 12, wherein said multiplexer section comprises:

a selecting section which transfers said first to fourth data to said fifth data bus in response to first to fourth control clock signals; and a control clock signal generating section which generates said first and second control clock signals during said first period of said second clock signal in response to said first clock signal, and generates said third and fourth control clock signals in said second period of said second clock signal.

16. The semiconductor memory device according to claim 15, wherein said selecting section comprises:

a first transfer gate connected with said first data bus and said fifth data bus to transfer said first data to said fifth data bus in response to said first control clock signal;

a second transfer gate connected with said second data bus and said fifth data bus to transfer said second data to said fifth data bus in response to said second control clock signal;

a third the transfer gate connected with said third data bus and said fifth data bus to transfer said third data to said fifth data bus in response to said third control clock signal; and a fourth transfer gate connected with said fourth data bus and said fifth data bus to transfer said fourth data to said fifth data bus in response to said fourth control clock signal.

17. The semiconductor memory device according to claim 15, wherein said control clock signal generating section has a counter with a reset terminal, said counter counts said first clock signal to output said first to fourth control clock signals, and said counter is reset in response to a reset signal supplied to said reset terminal.

18. The semiconductor memory device according to claim 12, wherein adjacent periods of said first clock signal corresponding to one period of said second clock signal are equal to each other.

19. The semiconductor memory device according to claim 12, wherein said clock signal generating section generates said first clock signal to have a phase more progressive by a predetermined phase than said first clock signal.

20. The semiconductor memory device according to claim 12, wherein said clock signal generating section generates said first clock signal based on one of a rising edge and a falling edge of said clock signal.

21. A method of reading out data from a specified one of a plurality of memory cell arrays, comprising the steps of:

(a) generating a single first clock signal from a second clock signal, said first clock signal having N times (N is an integer more than 1) of a frequency of said second clock signal;

(b) transferring said first clock signal to said plurality of memory cell arrays in a same delay time;

(c) generating N control clock signals from said first clock signal; and (d) outputting N data read out from said specified memory cell array during one period of said second clock signal, in response to said N control clock signals as a series of said N data.

22. The method according to claim 21, wherein said first clock signal has a phase more progressive by a predetermined phase than said second clock signal.

* * * * *

UNITED STATES PATENT AND TRADEMARK OFFICE
CERTIFICATE OF CORRECTION

PATENT NO. : 6,574,163 B2
DATED : June 3, 2003
INVENTOR(S) : Kazunori Maeda

It is certified that error appears in the above-identified patent and that said Letters Patent is hereby corrected as shown below:

<u>Title page,</u>
Item [73], Assignee, please insert -- NEC Electronics Corporation --

Signed and Sealed this

Sixteenth Day of December, 2003

JAMES E. ROGAN
*Director of the United States Patent and Trademark Office*